(12) United States Patent
Mori et al.

(10) Patent No.: US 11,675,404 B2
(45) Date of Patent: Jun. 13, 2023

(54) SEMICONDUCTOR DEVICE INCLUDING POWER FAILURE DETECTION CIRCUIT

(71) Applicant: RENESAS ELECTRONICS CORPORATION, Tokyo (JP)

(72) Inventors: Ryo Mori, Tokyo (JP); Kazuki Fukuoka, Tokyo (JP); Kenichi Shimada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 78 days.

(21) Appl. No.: 17/319,880

(22) Filed: May 13, 2021

(65) Prior Publication Data
US 2021/0365093 A1 Nov. 25, 2021

(30) Foreign Application Priority Data

May 25, 2020 (JP) .............................. JP2020-090225

(51) Int. Cl.
*G06F 1/26* (2006.01)
*G06F 1/28* (2006.01)

(52) U.S. Cl.
CPC ................ *G06F 1/263* (2013.01); *G06F 1/28* (2013.01)

(58) Field of Classification Search
CPC .................................. G06F 1/263; G06F 1/28
See application file for complete search history.

(56) References Cited

U.S. PATENT DOCUMENTS

| | | | |
|---|---|---|---|
| 6,201,997 B1 | 3/2001 | Giers | |
| 8,742,779 B2 | 6/2014 | Takahashi et al. | |
| 10,784,874 B1* | 9/2020 | Bang | G06F 30/39 |
| 2005/0207247 A1 | 9/2005 | Honda et al. | |
| 2016/0321070 A1* | 11/2016 | Okazaki | G06F 1/26 |
| 2018/0032124 A1* | 2/2018 | Fukuoka | G06F 1/3296 |
| 2019/0114243 A1* | 4/2019 | Santoni | G06F 11/1641 |
| 2019/0370130 A1* | 12/2019 | Meriac | G06F 11/1687 |
| 2020/0012328 A1* | 1/2020 | Sato | G06F 3/0673 |
| 2020/0233742 A1* | 7/2020 | Boettcher | G06F 11/1044 |
| 2021/0342213 A1* | 11/2021 | Kotary | G06F 11/0724 |

FOREIGN PATENT DOCUMENTS

| | | |
|---|---|---|
| EP | 2581806 A2 | 4/2013 |
| JP | 4393529 B2 | 1/2010 |
| JP | 2010-283230 A | 12/2010 |

OTHER PUBLICATIONS

European Search Report of EP counterpart application No. 21175460.1 dated Feb. 23, 2022 (9 pages).

* cited by examiner

*Primary Examiner* — Zahid Choudhury
(74) *Attorney, Agent, or Firm* — McDermott Will & Emery LLP

(57) ABSTRACT

A semiconductor device includes: a plurality of cores configured to receive power from a power supply; a plurality of power switch circuits provided for each core and configured to control the power supplied to the corresponding cores; a compare circuit configured to receive power from the power supply and compare output data of the plurality of cores; and a core voltage monitor circuit configured to monitor a voltage of a node that connects the power supply and the compare circuit.

8 Claims, 14 Drawing Sheets

|   | REQ | ACK, ASEB | |
|---|---|---|---|
| 1 | H | H | PSW ON |
| 2 | H | L (>trmax) | PSW ON ERROR |
| 3 | H | L (<trmax) | L->H transient state OK |
| 4 | L | H (<tfmax) | H->L transient state OK |
| 5 | L | H (>tfmax) | PSW OFF ERROR |
| 6 | L | L | PSW OFF |

SEMICONDUCTOR DEVICE INCLUDING POWER FAILURE DETECTION CIRCUIT

CROSS-REFERENCE TO RELATED APPLICATIONS

The disclosure of Japanese Patent Application No. 2020-090225 filed on May 25, 2020 including the specification, drawings and abstract is incorporated herein by reference in its entirety.

BACKGROUND

The present invention relates to a semiconductor device.

In an in-vehicle low-power semiconductor device, logic failures and power supply failures are detected in order to ensure safety. In addition, due to the demand for low power, the power shut-off to the core by the power switch is performed. For example, Patent Document 1 discloses a technique for detecting the logic failure by a lock step configuration provided with a compare circuit for comparing a master core and a checker core. On the other hand, the power supply failure is detected by measuring the voltage of the power supply node connected to the power supply using a voltage monitor.

There are disclosed techniques listed below.

[Patent Document 1] Japanese Unexamined Patent Application Publication No. 2010-283230

SUMMARY

However, since the voltage monitor is required for each of the master core and the checker core in the configuration of the Patent Document 1, the area of the voltage monitor is increased.

The other problem and novel feature will be apparent from the description of this specification and the accompanying drawings.

The present invention has been made in view of the above, and one of the objects thereof is to provide a semiconductor device in which the increase in chip area is suppressed while ensuring safety.

The typical invention disclosed in this application will be simply described as follows. A typical semiconductor device includes: a plurality of cores configured to receive power from a power supply; a plurality of power switch circuits provided for each core and configured to control the power supplied to the corresponding cores; a compare circuit configured to receive power from the power supply and compare output data of the plurality of cores; and a core voltage monitor circuit configured to monitor a voltage of a node that connects the power supply and the compare circuit.

The effect obtained by the typical invention disclosed in this application will be simply described as follows. According to the typical semiconductor device, it is possible to suppress the increase in chip area while ensuring safety.

DETAILED DESCRIPTION

Figure 21:
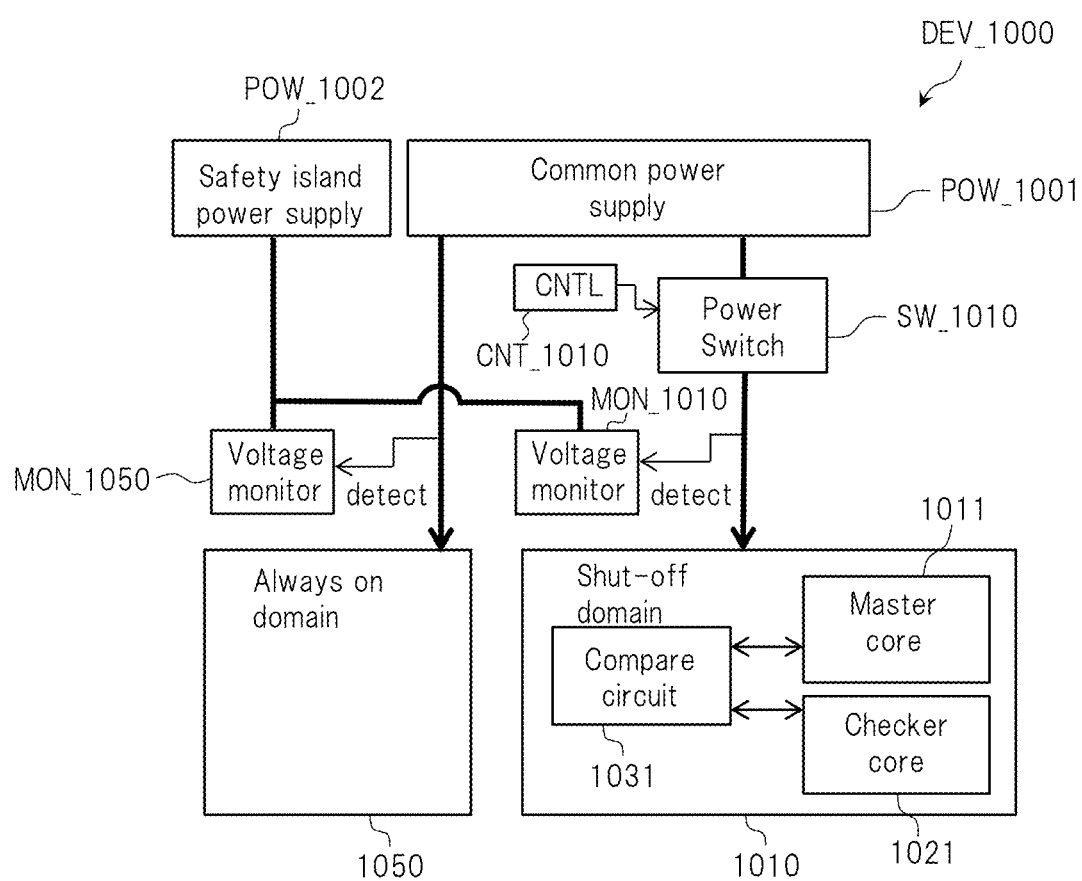
FIG. 21 is a configuration diagram showing an example of a conventional semiconductor device.

A supplementary description about the problem will be given below. FIG. 21 is a configuration diagram showing an example of a conventional semiconductor device. A semiconductor device 1000 includes a power shut-off domain 1010 of which the power from a power supply POW_1001 is controlled to be turned on and off and an always-on domain 1050 to which the power from the power supply POW_1001 is constantly supplied. The power supply of the power shut-off domain 1010 and the always-on domain 1050 is the power supply POW_1001.

In addition, the semiconductor device 1000 includes a power switch circuit SW_1010 that controls the ON and OFF of the power supply to the power shut-off domain 1010, a power switch controller CNT_1010 that controls the power switch circuit SW_1010, a monitor circuit MON_1010 that monitors a voltage of a node that connects the power switch circuit SW_1010 and the power shut-off domain 1010, and a monitor circuit MON_1050 that monitors a voltage of a node that connects the power supply POW_1001 and the always-on domain 1050.

As shown in FIG. 21, the power shut-off domain 1010 includes a master core 1011, a checker core 1021, and a compare circuit 1031. The master core 1011 and the checker core 1021 have the same circuit configuration, and the same data is input to each of them. The master core 1011 and the checker core 1021 each output predetermined output data based on the input data to the compare circuit 1031. The compare circuit 1031 compares each output data output from the master core 1011 and the checker core 1021. If it is determined that these output data are different from each other and some kind of failure has occurred, the compare circuit 1031 outputs an error.

As shown in FIG. 21, the master core 1011, the checker core 1021, and the compare circuit 1031 are arranged in the same power shut-off domain 1010. Namely, power is supplied to the master core 1011, the checker core 1021, and the compare circuit 1031 via the same power switch circuit SW_1010. If the power switch circuit SW_1010 or the power switch controller CNT_1010 does not have failure, a predetermined voltage is supplied to the master core 1011, the checker core 1021, and the compare circuit 1031. In this case, the master core 1011, the checker core 1021, and the compare circuit 1031 operate normally, and the failure that occurs in the master core 1011 or the checker core 1021 is detected by the compare circuit 1031.

On the other hand, when a potential drop occurs in the power supplied to the power shut-off domain 1010 due to the failure of the power switch circuit SW_1010 or the like, there is the fear that the master core 1011, the checker core 1021, and the compare circuit 1031 cannot operate normally. In this case, there is the fear that the compare circuit 1031 erroneously detects the failure occurrence though no failure occurs in the master core 1011 and the checker core 1021 or the compare circuit 1031 determines that no failure occurs though the failure actually occurs.

Therefore, in the conventional configuration, it is necessary to detect a failure of the power supply by monitoring the supplied power of the power switch circuit SW_1001 using the monitor circuit MON_1010. Further, in order to detect the power supply failure of the power supply POW_1001 supplied to the always-on domain 1050, it is necessary to provide a voltage monitor MON_1050. Namely, in the conventional configuration, it is necessary to provide a plurality of monitor circuits MON_1010 and MON_1050 for the same power supply POW_1001. Consequently, when a plurality of power shut-off domains having different controls are required, it is necessary to mount a voltage monitor corresponding to each power shut-off domain, resulting in the problem of the increase in chip area.

The embodiments of the present invention will be described below in detail with reference to drawings. Note that the same components are denoted by the same reference characters in all the drawings for describing the embodiments and the repetitive description thereof will be omitted.

First Embodiment

<Configuration of Semiconductor Device>

Figure 1:
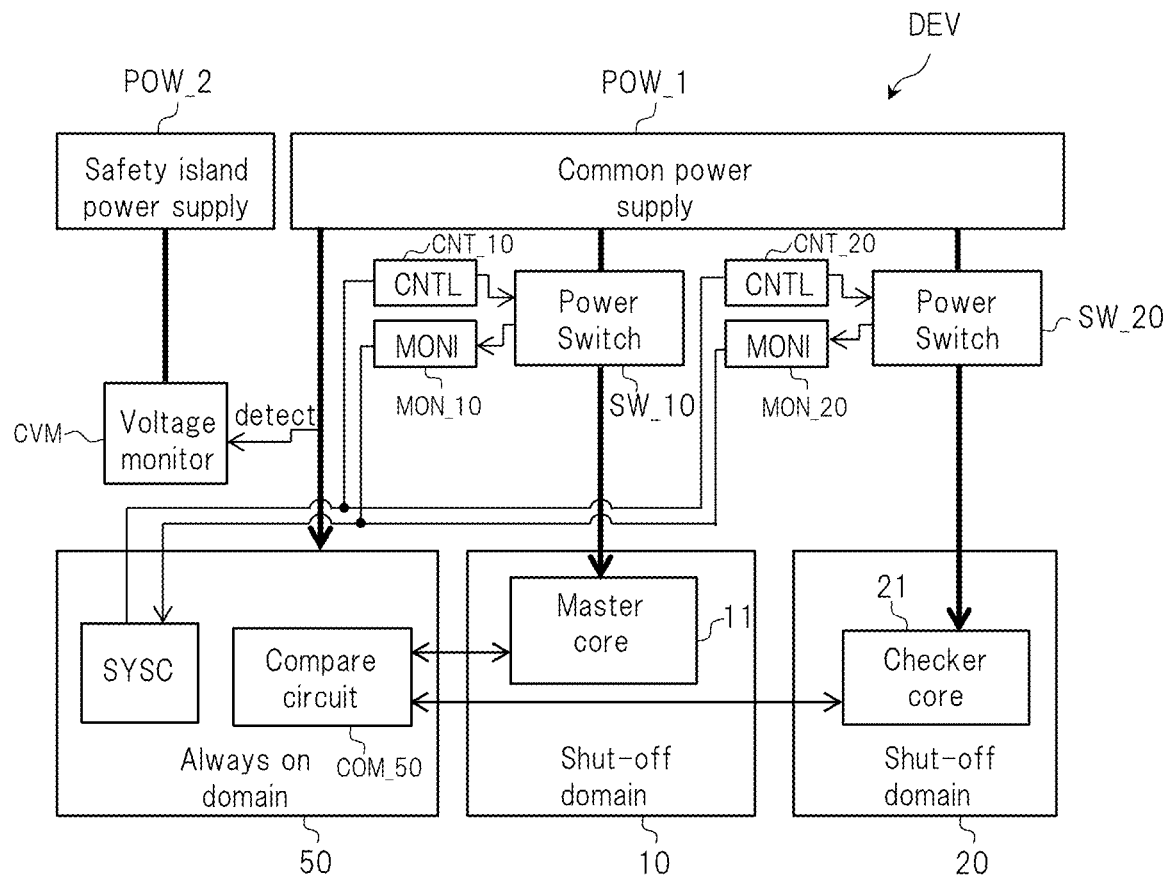
FIG. 1 is a configuration diagram showing an example of an in-vehicle semiconductor device according to the first embodiment of the present invention.
Figure 2:
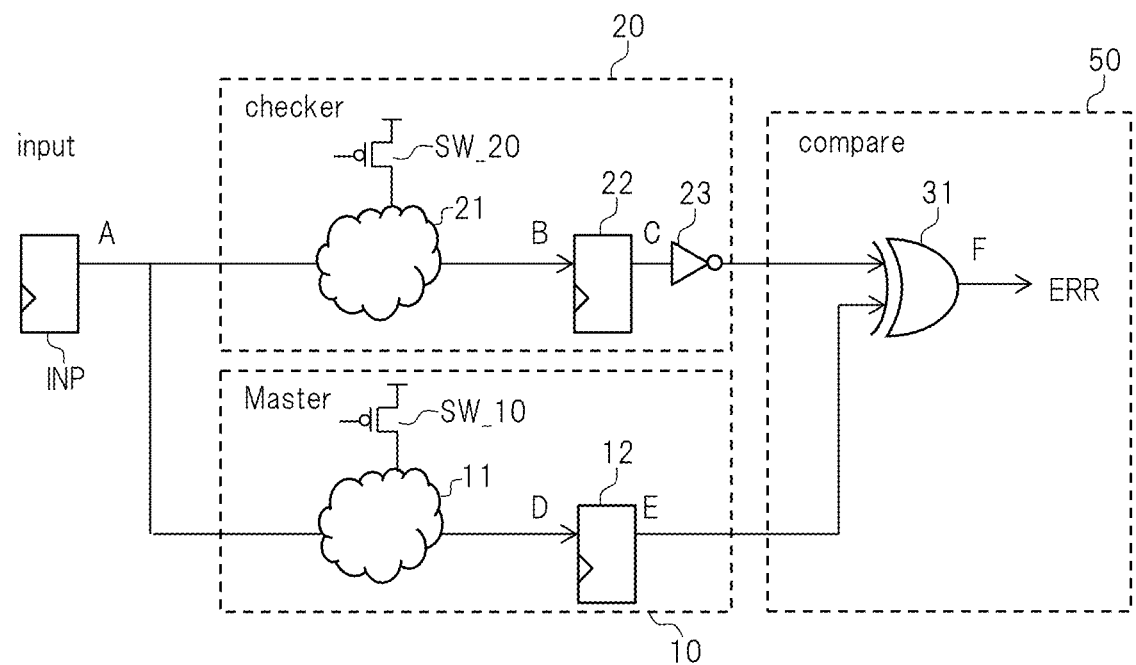
FIG. 2 is a diagram specifically showing an example of a circuit configuration relating to failure detection in the semiconductor device.

FIG. 1 is a configuration diagram showing an example of a semiconductor device according to the first embodiment of the present invention. FIG. 2 is a diagram specifically showing an example of a circuit configuration relating to failure detection in the semiconductor device. As shown in FIG. 1, a semiconductor device DEV of the present embodiment includes power shut-off domains 10 and 20 of which the power from a power supply POW_1 is controlled to be turned on and off and an always-on domain 50 to which the power from the power supply POW_1 is constantly supplied. A power supply POW_2 is a power supply of a core voltage monitor circuit CVM or the like. The power supply of the power shut-off domains 10 and 20 and the always-on domain 50 is the power supply POW_1.

The semiconductor device DEV includes a power switch circuit SW_10 that controls the ON and OFF of the power supply to the power shut-off domain 10, a power switch controller CNT_10 that controls the power switch circuit SW_10, and a monitor circuit MON_10 that monitors a voltage of a node that connects the power switch circuit SW_10 and the power switch controller CNT_10.

Further, the semiconductor device DEV includes a power switch circuit SW_20 that controls the ON and OFF of the power supply to the power shut-off domain 20, a power switch controller CNT_20 that controls the power switch circuit SW_20, and a monitor circuit MON_20 that monitors a voltage of a node that connects the power switch circuit SW_20 and the power switch controller CNT_20. Further, the semiconductor device DEV includes a core voltage monitor circuit CVM that monitors a voltage of a node that connects the power supply POW_1 and the always-on domain 50. In other words, the core voltage monitor circuit CVM monitors a voltage of a node that connects the power supply POW_1 and a compare circuit COM_50.

In the following, the power switch controllers CNT_10 and CNT_20 may be referred to as a power switch controller CNT. Further, the power switch circuits SW_10 and SW_20 may be referred to as a power switch circuit SW.

As shown in FIG. 1 and FIG. 2, the power shut-off domain 10 includes a master core 11 and a flip-flop circuit 12. Note that the flip-flop circuit 12 may be included in the master core 11. Although the power switch circuit SW_10 is included in the power shut-off domain 10 in FIG. 2, the configuration is not limited to this.

The power shut-off domain 20 includes a checker core 21, a flip-flop circuit 22, and an inverter circuit 23. The checker core 21 and the flip-flop circuit 22 have the same configuration as the master core 11 and the flip-flop circuit 12 in the power shut-off domain 10, respectively. Therefore, when no failure has occurred, the output data output from the inverter circuit 23 is inverted data of the output data output from the flip-flop circuit 12 in the power shut-off domain 10. Note that the flip-flop circuit 22 and the inverter circuit 23 may be included in the checker core 21. Although the power switch circuit SW_20 is included in the power shut-off domain 20 in FIG. 2, the configuration is not limited to this.

The always-on domain 50 includes the compare circuit COM_50 and a system controller SYSC. The compare circuit COM_50 is composed of, for example, an EOR (Exclusive OR) circuit shown in FIG. 2. The compare circuit COM_50 outputs an error when the output data of the power shut-off domain 10 (flip-flop circuit 12) and the output data of the power shut-off domain 20 (inverter circuit 23) match. Namely, the compare circuit COM_50 outputs an error when the output data of the flip-flop circuit 12 and the output data of the flip-flop circuit 22 do not match.

More specifically, if no failure has occurred, the output data of the master core 11 and the checker core 21 have substantially the same waveform. Further, the output data of the checker core 21 is inverted by the inverter circuit 23. Therefore, the compare circuit COM_50 does not output an error when the output data of the flip-flop circuit 12 and the output data of the inverter circuit 23 are different, and outputs an error when these output data match.

Figure 3:
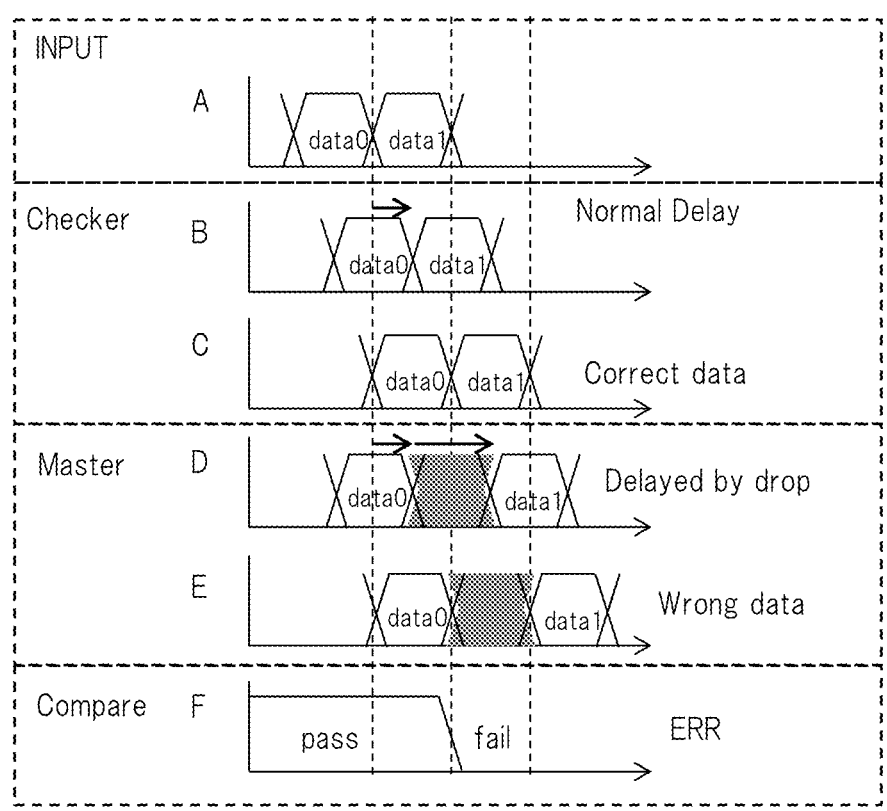
FIG. 3 is a timing chart for describing a failure detection method.

FIG. 3 is a timing chart for describing a failure detection method. FIG. 3 shows the data of each node A to F in FIG. 2. The data of the node A is the input data to the master core 11 and the checker core 21. The data of the node B is the output signal of the checker core 21. The data of the node C is the output data of the flip-flop circuit 22. The data of the node D is the output data of the master core 11. The data of the node E is the output data of the flip-flop circuit 12. The data of the node F is the output data of the compare circuit COM_50, that is, the failure detection result.

Note that it is assumed in FIG. 3 that a failure occurs in the power switch circuit SW_10 or the power switch controller CNT_10 for the power shut-off domain 10 and the potential drop occurs in the power supplied to the master core 11.

The input data (node A) to the checker core 21 is output after being normally delayed in the flip-flop circuit 22 (node B, node C). The output data output from the inverter circuit 23 is supplied to the compare circuit COM_50.

On the other hand, in the master core 11, the input data (node A) is output with a delay larger than usual due to the potential drop (node D). In the example of FIG. 3, "data 1" is affected by the potential drop. Therefore, "data 0" is output with a normal delay, but "data 1" is output with a delay larger than usual. Therefore, since the master core 11 cannot output "data 1" at a predetermined timing with a normal delay, the flip-flop circuit 12 in the subsequent stage cannot receive "data 1" at the predetermined timing. Consequently, the flip-flop circuit 12 outputs erroneous data due to the setup violation (node E). The compare circuit COM_50 outputs an error at the timing when the erroneous data is output from the flip-flop circuit 12. For example, an error flag is issued.

As described above, by separately performing the ON and OFF of the power supply to the power shut-off domain 10 including the master core 11 and the ON and OFF of the power supply to the power shut-off domain 20 including the checker core 21, the failure in the power supply path including the power switch circuits SW_10 and SW_20 and the power switch controllers CNT_10 and CNT_20 can be detected as a logic failure due to the potential drop. As a result, the voltage monitor for detecting the abnormality of the power supply node that connects the power switch and the corresponding power shut-off domain becomes unnecessary, and the area required for arranging the voltage monitor can be reduced.

The system controller SYSC controls the plurality of power switch controllers CNT. Namely, the system controller SYSC is a higher-level device relating to the power supply for controlling the power switch controllers CNT_10 and CNT_20. The system controller SYSC simultaneously executes the ON/OFF control of the power switch circuit SW_10 by the power switch controller CNT_10 and the ON/OFF control of the power switch circuit SW_20 by the power switch controller CNT_20 by asserting/negating a common request signal REQ.

Alternatively, the system controller SYSC may separately execute the ON/OFF control of the power switch circuit SW_10 by the power switch controller CNT_10 and the ON/OFF control of the power switch circuit SW_20 by the power switch controller CNT_20 by asserting/negating independent request signals REQ corresponding to the power switch controllers CNT_10 and CNT_20, respectively.

Also, the system controller SYSC receives the monitoring result of the power supply path including the power switch circuit by the plurality of monitor circuits MON, and controls the power switch controller CNT based on the monitoring result.

<<Control Method of Power Switch Circuit (1)>>

Figure 4:
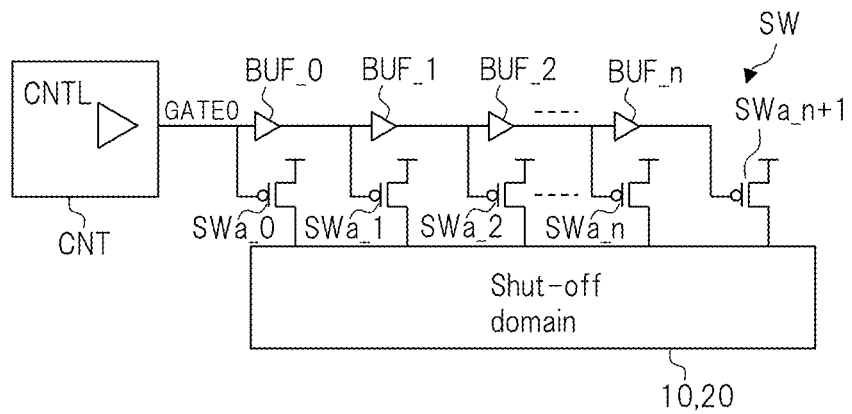
FIG. 4 is a diagram showing an example of a connection relationship of a controller and a power switch circuit.
Figure 5:
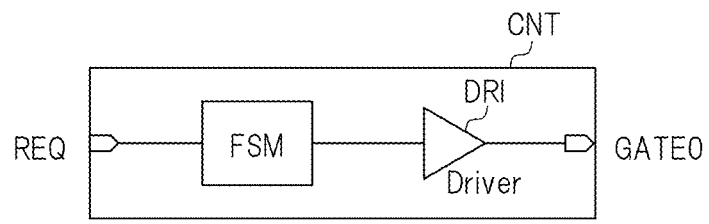
FIG. 5 is a configuration diagram showing an example of the controller.

Next, a control method of the power switch will be described. FIG. 4 is a diagram showing an example of a connection relationship of a controller and a power switch circuit. FIG. 5 is a configuration diagram showing an example of the controller.

The switch circuit SW of FIG. 4 includes a plurality of switching elements SWa (SWa_0 to SWa_n+1), and has the configuration in which the plurality of switching elements SWa are arranged in parallel between the power supply and the power shut-off domain (master core 11 or checker core 21). Further, each of buffers BUF (BUF_0 to BUF_n) is arranged between the gates of adjacent switching elements SWa. The gate of the switching element SWa_0 at the first stage on the side of the power switch controller CNT is directly connected to the power switch controller CNT. On the other hand, the switching elements SWa_1 to SWa_n+1 are connected to the power switch controller CNT via the buffers BUF.

As shown in FIG. 5, the power switch controller CNT includes, for example, a state machine FSM (Finite State Machine) and a buffer driver DRI that drives the power switch circuit SW.

The state machine FSM makes a state transition from the mode of stopping the power switch circuit SW to the mode of driving the power switch circuit SW (ON control) when the request signal REQ is asserted from the system controller SYSC, and outputs the power supply control signal (for example, low level) to the buffer driver DRI. The buffer driver DRI performs the current amplification of the power supply control signal and outputs the power supply control signal subjected to the current amplification to the power switch circuit SW. The power supply control signal output from the buffer driver DRI is supplied to the gate of the switching element SWa_0, and the switching element SWa_0 is turned on. As a result, power is supplied to the power shut-off domain via the switching element SWa_0.

Also, the power supply control signal output from the buffer driver DRI is supplied also to the buffer BUF_0. The power supply control signal supplied to the buffer BUF_0 is output with a predetermined delay.

The power supply control signal output from the buffer BUF_0 is supplied to the gate of the switching element SWa_1 and the buffer BUF_1. When the power supply control signal is supplied to the gate of the switching element SWa_1, the switching element SWa_1 is turned on. As a result, power is supplied to the power shut-off domain also via the switching element SWa_1.

Since the power supply control signal is delayed in the buffer BUF_0, the timing at which the switching element SWa_1 is turned on is delayed from the switching element SWa_0 by the delay time in the buffer BUF_0. As to the switching elements SWa_2, SWa_3, . . . , SWa_n+1, the timing at which each switching element is turned on is delayed from the immediately preceding switching elements SWa_1, SWa_2, . . . , SWa_n by the delay time in the immediately preceding buffers BUF_1, BUF_2, . . . , BUF_n, respectively.

As described above, in the example of FIG. 4, the inrush current in the power switch circuit SW can be suppressed by sequentially shifting the timing at which the plurality of switching elements SWa are turned on by using the delay by buffering. In the example of FIG. 4, the inrush current can be suppressed by, for example, a simple logic circuit shown in FIG. 5.

<<Control Method of Power Switch Circuit (2)>>

Next, as another control method of the power switch circuit, a method of supplying power while switching buffer drivers having different capabilities will be described here.

Figure 6:
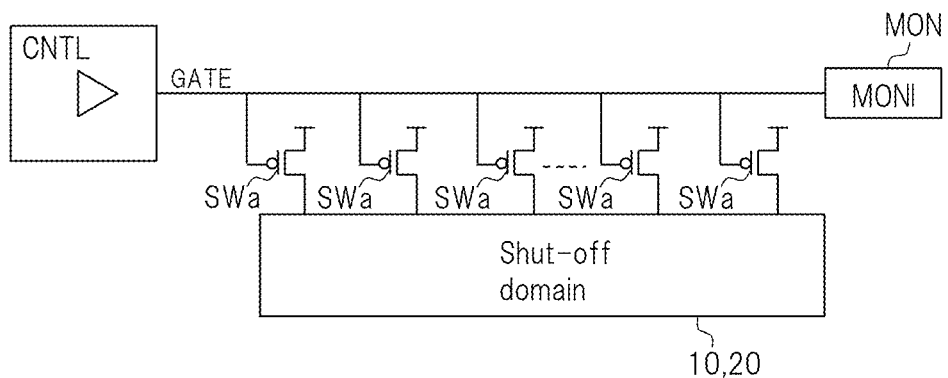
FIG. 6 is a diagram showing another example of the connection relationship of the controller and the power switch circuit.

FIG. 6 is a diagram showing another example of the connection relationship of the controller and the power switch circuit. FIG. 6 also shows the monitor circuit MON.

In the power switch circuit SW of FIG. 6, no buffer is provided between the gates of the adjacent switching elements SWa, and the gates of all the switching elements SWa are connected to the power switch controller CNT. Therefore, the power supply control signal output from the power switch controller CNT is supplied to the gates of all the switching elements SWa included in the power switch circuit SW almost at the same time.

Figure 7:
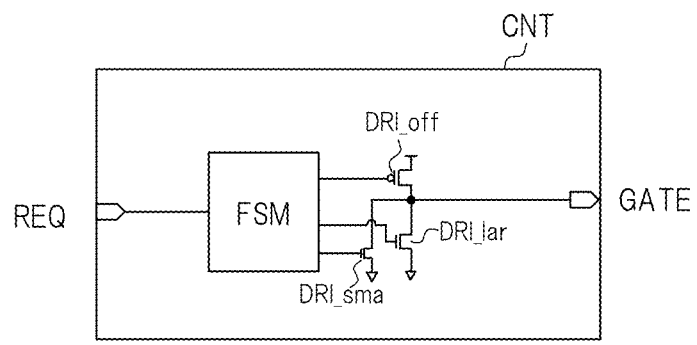
FIG. 7 is a configuration diagram showing another example of the controller.

FIG. 7 is a configuration diagram showing another example of the controller. The power switch controller CNT of FIG. 7 includes the state machine FSM, an off-driver DRI_off, a small driver DRI_sma having a low capability, and a large driver DRI_lar having a higher capability than the small driver DRI_sma.

The state machine FSM is in the mode of stopping the power switch circuit SW until the request signal REQ is asserted from the system controller SYSC. In the mode of stopping the power switch circuit SW, the state machine FSM turns on the off-driver DRI_off, turns off the small driver DRI_sma, and turns off the large driver DRI_lar. Consequently, a high level is supplied to the gates of all the switching elements SWa, and all the switching elements SWa are brought into an OFF state. As a result, the power switch circuit SW stops the power supply to the corresponding power shut-off domain.

Then, when the request signal REQ is asserted from the system controller SYSC, the state machine FSM makes a state transition to the mode of driving the small driver DRI_sma. In the mode of driving the small driver DRI_sma, the state machine FSM turns off the off-driver DRI_off, turns on the small driver DRI_sma, and maintains the large driver DRI_lar in the OFF state.

Consequently, the small driver DRI_sma pulls out the gate voltage of the switching element SWa. However, since the capability of the small driver DRI_sma is low, the gate voltage of the switching element SWa is gradually pulled out, so that the switching element SWa is gradually brought into the ON state. Therefore, the resistance of the switching element SWa is large, and the amount of inrush current is suppressed.

Then, when the inrush current is sufficiently flown, the state machine FSM makes a state transition to the mode of driving the large driver DRI_lar. In the mode of driving the large driver DRI_lar, the state machine FSM maintains the off-driver DRI_off in the OFF state, maintains the small driver DRI_sma in the ON state, and turns on the large driver DRI_lar. As a result, the gate voltage of the switching element SWa is pulled out at once to the low level, and the power switch circuit SW is brought into a complete ON state. Therefore, the resistance of the switching element SWa becomes sufficiently small, and the power switch circuit SW can supply power to the power shut-off domain with low resistance.

As described above, the state machine FSM is configured to control the gate voltage of the switching element SWa in two steps, so that the power switch circuit SW can supply power while suppressing the inrush current. Further, the state machine FSM turns on the off-driver DRI_off, whereby the power switch circuit SW can stop the power supply to the power shut-off domain.

0049 As shown in FIG. 6, the monitor circuit MON is arranged on the side opposite to the power switch controller CNT with respect to the power switch circuit SW. The monitor circuit MON monitors the gate voltage of the switching element SWa located at the position farthest from the power switch controller CNT. As described above, it is desirable that the monitor circuit MON monitors the gate voltage of the switching element SWa located at the farthest end from the power switch controller CNT. This makes it possible to improve the detection sensitivity.

Figure 8:
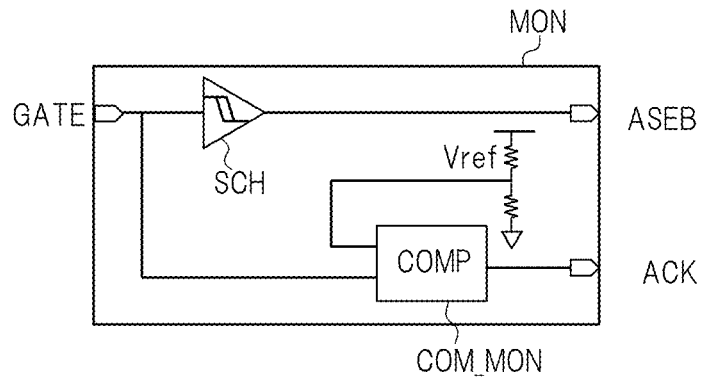
FIG. 8 is a diagram showing an example of a monitor circuit.

FIG. 8 is a diagram showing an example of the monitor circuit. As shown in FIG. 8, the monitor circuit MON includes a Schmidt circuit SCH, a comparator (monitor comparator) COM_MON, and the like. The Schmidt circuit SCH monitors the gate voltage of the switching element SWa to detect whether or not the inrush current of the small driver DRI_sma has been completely flown. Namely, the Schmidt circuit SCH monitors the gate voltage of the switching element SWa when the small driver DRI_sma is turned on and the large driver DRI_lar is turned off.

In this state, gate drive is performed with a minute current. Therefore, a Schmidt circuit is used so that fluctuations in the gate voltage due to disturbance noise do not cause the malfunction. When the gate voltage of the switching element SWa reaches the voltage at the time when the inrush current of the small driver DRI_sma has been completely flown, the Schmidt circuit SCH asserts a Schmidt circuit detection signal ASEB.

When the Schmidt circuit detection signal ASEB is asserted, the power switch controller CNT turns off the small driver DRI_sma and turns on the large driver DRI_lar. Consequently, the current switch circuit SW can be brought into the low-resistance state without generating the inrush current.

The monitor circuit MON monitors the gate voltage of the switching element SWa with a minute current. Therefore, when a part of the gate of the switching element SWa is broken and the gate is short-circuited to the power supply on the Power side or the power supply on the Ground side, the Schmidt circuit detection signal ASEB is stuck. As a result, the switching element SWa cannot respond to the request signal REQ. As described above, the monitor circuit MON can detect the abnormality of the gate voltage with high sensitivity.

Since the minute driver current flowing through the small driver DRI_sma is on the uA order, the monitor circuit MON can detect a high-resistance short circuit on the uA order. Further, the comparator COM can detect that the gate voltage has dropped sufficiently after the large driver DRI_lar is turned on.

The gate voltage of the switching element SWa and the reference voltage Vref are input to the comparator COM_MON. The reference voltage Vref is generated by a resistor element provided between the comparator COM_MON and the power supply on the Power side or the power supply on the Ground side. The reference voltage Vref is set to, for example, 11% of the power supply voltage (VDD) on the Power side.

The comparator COM_MON monitors the gate voltage of the switching element SWa when the large driver DRI_lar is turned on. The comparator COM_MON asserts the power shut-off recovery signal ACK when, for example, the gate voltage of the switching element SWa becomes smaller than the reference voltage Vref. The power shut-off recovery signal ACK is input to, for example, the system controller SYSC or the like such as a power management unit or the like. By the voltage detection based on two types of different systems by the Schmidt circuit SCH and the comparator COM_MON, the common fail is avoided and the safety is improved.

Figure 9:
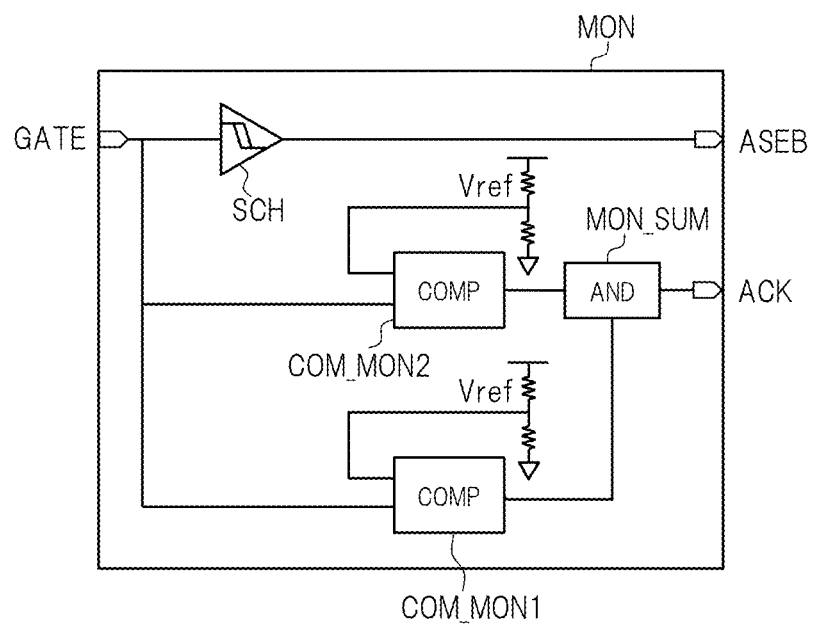
FIG. 9 is a diagram showing another example of the monitor circuit.

FIG. 9 is a diagram showing another example of the monitor circuit. In the monitor circuit MON of FIG. 9, the Schmidt circuit SCH can easily perform the self-diagnosis by verifying the low (L) and high (H) responses. On the other hand, since the comparator COM_MON is configured to perform the detection by level sensing, it is necessary to verify the latency thereof for the self-diagnosis, and thus the self-diagnosis of the comparator COM_MON is difficult. Therefore, as shown in FIG. 9, the monitor circuit MON is provided with a plurality of comparators (COM_MON1, COM_MON2) and a circuit that aggregates the detection results of these comparators, for example, a circuit MON_SUM (for example, AND circuit) that outputs a detection signal only when both of them detect the ON. By multiplexing (duplicating) the comparator COM_MON in this way, the failure probability can be reduced and the safety can be improved.

<<Failure Detection Method of Power Switch Circuit>>

Figure 10:
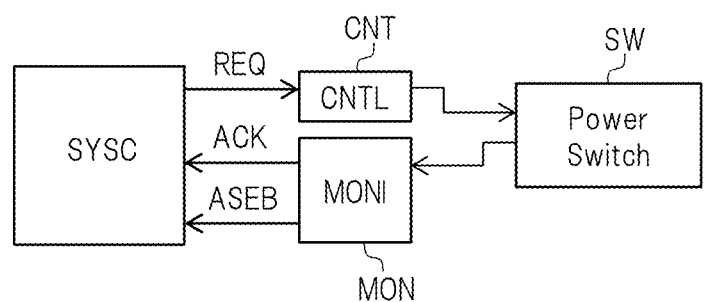
FIG. 10 is a block diagram showing a relationship of a power switch circuit, a power switch controller, a monitor circuit, and a system controller which controls them.

A failure detection method of the power switch circuit by real-time monitoring using a monitor circuit will be described with reference to FIG. 10 and FIG. 11. FIG. 10 is a block diagram showing a relationship of a power switch circuit, a power switch controller, a monitor circuit, and a system controller which controls them.

As shown in FIG. 10, the system controller SYSC gives an instruction of power recovery to the power switch controller CNT by asserting the request signal REQ, and gives an instruction of power shut-off to the power switch controller CNT by negating the request signal REQ.

When the request signal REQ is asserted, the power switch controller CNT turns on the power switch circuit SW by turning on the gate of the switching element SWa, thereby supplying power to the corresponding power shut-off domain (power recovery). On the other hand, when the request signal REQ is negated, the power switch controller CNT turns off the power switch circuit SW by turning off the gate of the switching element SWa, thereby stopping the power supply to the corresponding power shut-off domain (power shut-off).

When the power recovery is completed, the monitor circuit MON asserts the power shut-off recovery signal ACK and notifies the system controller SYSC of the completion of the power recovery. On the other hand, when the power shut-off is completed, the monitor circuit MON negates the power shut-off recovery signal ACK and notifies the system controller SYSC of the completion of the power shut-off.

Figure 11:
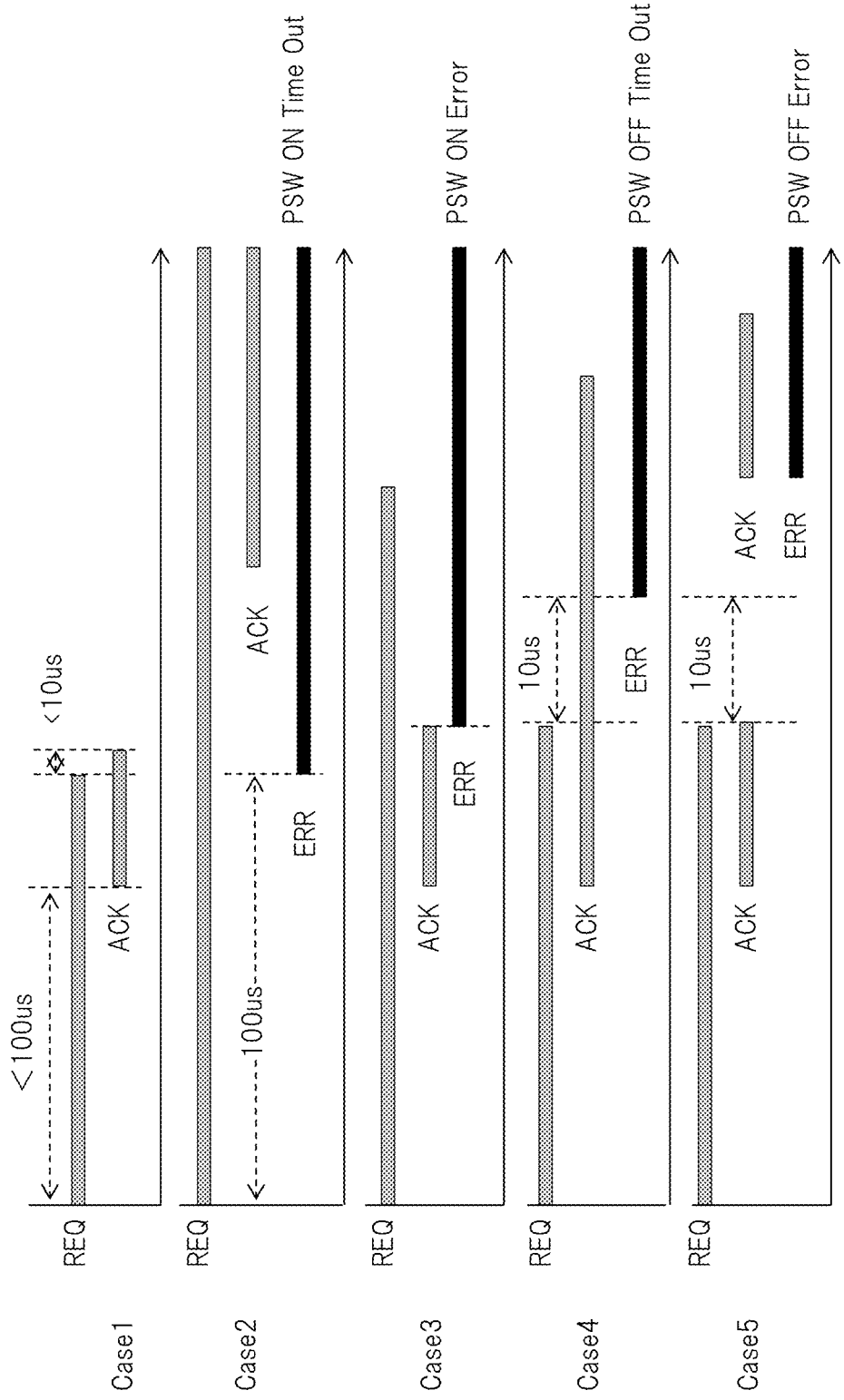
FIG. 11 is a diagram for describing a failure detection method of the power switch circuit by monitoring a request signal and a power shut-off recovery signal.

FIG. 11 is a diagram for describing a failure detection method of the power switch circuit by monitoring the request signal and the power shut-off recovery signal. Case 1 of FIG. 11 shows the normal operation. In Case 1, the power switch circuit SW is turned on to complete the power recovery and the power shut-off recovery signal ACK is asserted in less than 100 usec after the request signal REQ is asserted (transmitted) by the system controller SYSC. The power switch circuit SW is turned off and the power shut-off recovery signal ACK is negated in less than 10 us after the request signal REQ is negated.

In Case 2, it takes 100 usec or more from when the request signal REQ is asserted to when the power shut-off recovery signal ACK is asserted. In this case, the system controller SYSC detects an ON failure of the power switch circuit SW as Time Out Error.

In Case 3, the power shut-off recovery signal ACK is asserted in less than 100 usec after the request signal REQ is asserted, but the power shut-off recovery signal ACK is negated during the assertion period of the request signal REQ. In this case, the system controller SYSC detects an ON failure of the power switch circuit SW.

In Case 4, even though the power shut-off is instructed by negating the request signal REQ, the power shut-off recovery signal ACK is not negated in less than a predetermined time (10 usec). In this case, the system controller SYSC detects an OFF failure of the power switch circuit SW as Time Out Error.

In Case 5, the power shut-off recovery signal ACK is asserted during the period when the request signal REQ is not asserted. In this case, the system controller SYSC detects an OFF error of the power switch circuit SW which cannot maintain the power shut-off.

Figure 12:
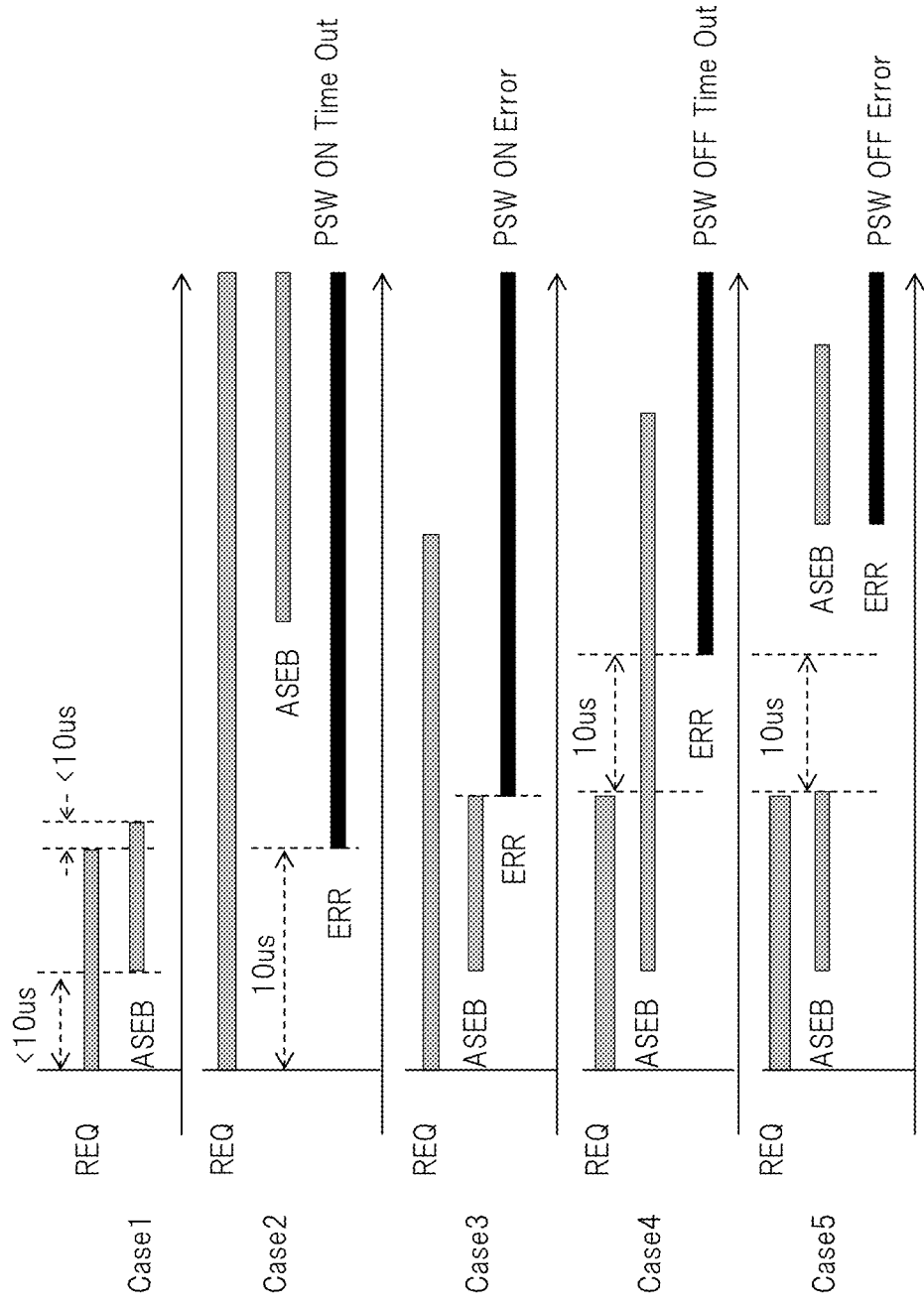
FIG. 12 is a diagram for describing a failure detection method of the power switch circuit by a Schmidt circuit in the case of using a small driver system.

FIG. 12 is a diagram for describing a failure detection method of the power switch circuit by a Schmidt circuit in the case of using a small driver system. A response time to the request signal REQ of the Schmidt circuit detection signal ASEB is shorter than that of the power shut-off recovery signal ACK. Therefore, in FIG. 12, the failure detection is performed based on whether the response time of the Schmidt circuit detection signal ASEB to the request signal REQ is less than 10 usec.

Each Case in FIG. 12 corresponds to FIG. 11. In Case 1, the power switch circuit SW is turned on, the inrush current is completely flown, and the Schmidt circuit detection signal ASEB is asserted in less than 10 usec after the request signal REQ is asserted (transmitted) by the system controller SYSC. Also, the power switch circuit SW is turned off and the power shut-off recovery signal ACK is negated in less than 10 us after the request signal REQ is negated.

In Case 2, it takes 10 usec or more from when the request signal REQ is asserted to when the Schmidt circuit detection signal ASEB is asserted. In this case, the system controller SYSC detects an ON failure of the power switch circuit SW as Time Out Error.

In Case 3, the Schmidt circuit detection signal ASEB is asserted in less than 100 usec after the request signal REQ is asserted, but the Schmidt circuit detection signal ASEB is negated during the assertion period of the request signal REQ. In this case, the system controller SYSC detects an ON failure of the power switch circuit SW.

In Case 4, even though the power shut-off is instructed by negating the request signal REQ, the Schmidt circuit detection signal ASEB is not negated in less than a predetermined time (10 usec). In this case, the system controller SYSC detects an OFF failure of the power switch circuit SW as Time Out Error.

In Case 5, the Schmidt circuit detection signal ASEB is asserted during the period when the request signal REQ is not asserted. In this case, the system controller SYSC detects an OFF error of the power switch circuit SW which cannot maintain the power shut-off.

As described above, the failure detection for the same items as those of the case of FIG. 11 using the request signal REQ and the power shut-off recovery signal ACK can be performed by the request signal REQ and the Schmidt circuit detection signal ASEB. Also, by using the Schmidt circuit detection signal ASEB, the failure detection by the minute current with high sensitivity can be performed.

Figures 13, 14:
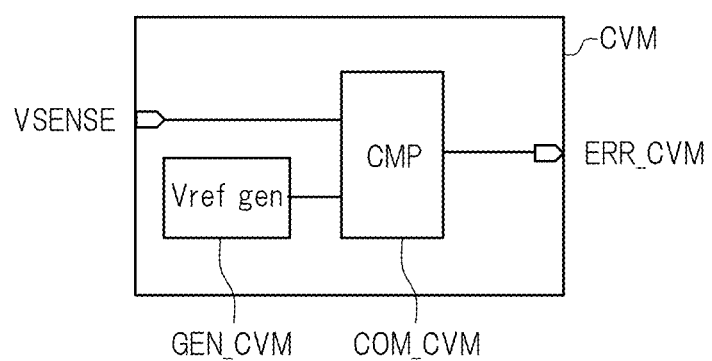
FIG. 13 is a diagram showing the correlation between each signal level and the state of the power switch circuit in failure detection.
FIG. 14 is a diagram showing a configuration example of a core voltage monitor circuit.

FIG. 13 is a diagram showing the correlation between each signal level and the state of the power switch circuit in failure detection. FIG. 13 shows the level of the request signal REQ, the level of the power shut-off recovery signal ACK or the Schmidt circuit detection signal ASEB, and the state of the power switch circuit.

In the example of FIG. 13, the request signal REQ is asserted in the high level and shows the state where the instruction of the power recovery is given. On the other hand, the request signal REQ is negated in the low level and shows the state where the instruction of the power shut-off is given.

The power shut-off recovery signal ACK is asserted in the high level and shows the state where the completion of the power recovery is notified. On the other hand, the power shut-off recovery signal ACK is negated in the low level and shows the state where the completion of the power shut-off is notified. Also, the Schmidt circuit detection signal ASEB is asserted in the high level and shows the state where the inrush current has been completely flown. The state where the inrush current has been completely flown corresponds to the power recovery. On the other hand, the Schmidt circuit detection signal ASEB is negated in the low level and shows the state where the power shut-off is completed.

Here, "trmax" in FIG. 13 is the first failure determination time (corresponding to 100 usec in FIGS. 11 and 10 usec in FIG. 12) allowed from when the request signal REQ is asserted to when the power shut-off recovery signal ACK or the Schmidt circuit detection signal ASEB is asserted. Also, "tfmax" in FIG. 13 is the second failure determination time (corresponding to 10 usec in FIG. 11 and FIG. 12) allowed from when the request signal REQ is negated to when the power shut-off recovery signal ACK or the Schmidt circuit detection signal ASEB is negated.

The first row of FIG. 13 is a state where the request signal REQ is asserted and the power shut-off recovery signal ACK or the Schmidt circuit detection signal ASEB is asserted. Namely, this state corresponds to the state where the power switch circuit SW is turned on.

The second row of FIG. 13 is a state where the power shut-off recovery signal ACK or the Schmidt circuit detection signal ASEB is not asserted even though the first failure determination time trmax elapses after the request signal REQ is asserted. Namely, this state corresponds to the state where an ON failure of the power switch circuit SW is detected.

The third row of FIG. 13 is a temporary state where the power shut-off recovery signal ACK or the Schmidt circuit detection signal ASEB is not asserted yet before the first failure determination time trmax elapses after the request signal REQ is asserted. Namely, this state corresponds to the state immediately before the power switch circuit SW is turned on.

The fourth row of FIG. 13 is a temporary state where the power shut-off recovery signal ACK or the Schmidt circuit detection signal ASEB is not negated yet before the second failure determination time tfmax elapses after the request signal REQ is negated. Namely, this state corresponds to the state immediately before the power switch circuit SW is turned off.

The fifth row of FIG. 13 is a state where the power shut-off recovery signal ACK or the Schmidt circuit detection signal ASEB is not negated even though the second failure determination time tfmax elapses after the request signal REQ is negated. Namely, this state corresponds to the state where an OFF failure of the power switch circuit SW is detected.

The sixth row of FIG. 13 is a state where the request signal REQ is negated and the power shut-off recovery signal ACK or the Schmidt circuit detection signal ASEB is negated. Namely, this state corresponds to the state where the power switch circuit SW is turned off.

FIG. 14 is a diagram showing a configuration example of the core voltage monitor circuit. As shown in FIG. 14, the core voltage monitor circuit CVM includes a comparator COM_CVM and a reference voltage generating circuit GEN_CVM.

A terminal VSENSE of the core voltage monitor circuit CVM is connected to the wiring that connects the power supply POW_1 and the always-on domain 50. The voltage of the power supply POW_1 is input to the core voltage monitor circuit CVM via this wiring. Note that the terminal VSENSE can be connected to another wiring used for the voltage detection.

The voltage of the power supply POW_1 input from the terminal VSENSE is supplied to the comparator COM_CVM. The reference voltage generating circuit GEN_CVM generates a failure detection voltage Vref_GEN that determines whether or not a failure has occurred in the power supply POW_1, and supplies the voltage to the comparator COM_CVM. The comparator COM_CVM compares the voltage of the power supply POW_1 with the failure detection voltage Vref_GEN. When the voltage of the power supply POW_1 is lower than the failure detection voltage Vref_GEN, the comparator COM_CVM detects the failure of the power supply POW_1 and issues a flag of power supply error. The issued flag is output from a terminal ERR_CVM and input to, for example, the system controller SYSC.

<Error Processing>

Figure 15:
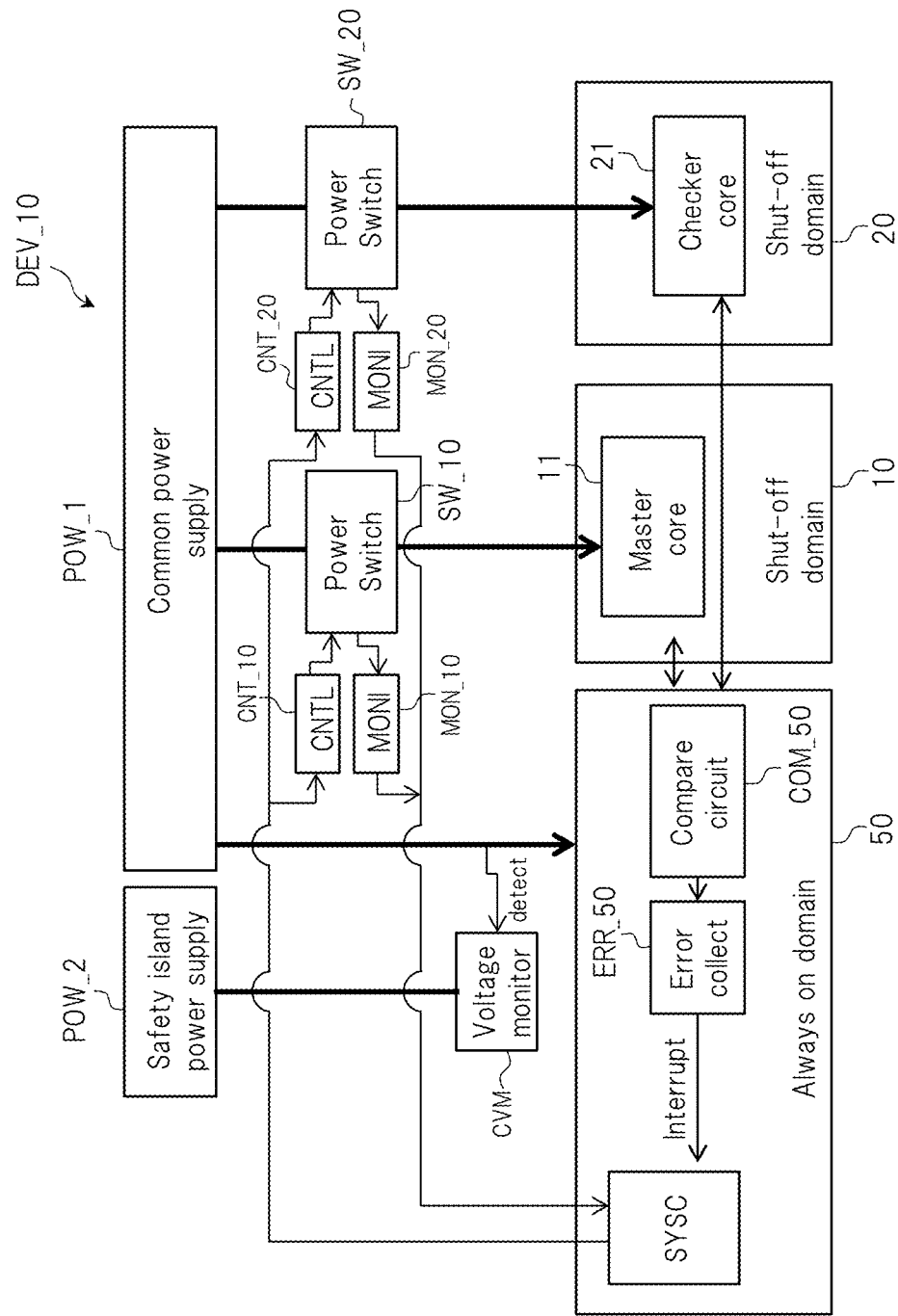
FIG. 15 is a configuration diagram showing an example of a semiconductor device having an error processing function according to the first embodiment of the present invention.

Next, an error processing according to the present embodiment will be described with reference to FIG. 15 and FIG. 16. FIG. 15 is a configuration diagram showing an example of a semiconductor device having an error processing function according to the first embodiment of the present invention. A semiconductor device DEV_10 of FIG. 15 is similar to the semiconductor device DEV of FIG. 1. The difference is that an error collection circuit ERR_50 is provided in the always-on domain 50 of the semiconductor device DEV_10.

First, the outline of the error processing will be described. When the system controller SYSC asserts or negates the request signal REQ, the power shut-off or the power recovery is requested from the system controller SYSC to the power switch controller CNT. The system controller SYSC is configured to be able to monitor the status in power control by receiving the completion notification of the power shut-off or the power recovery from the monitor circuit MON by assertion/negation of the power shut-off recovery signal ACK.

When the power switch circuit SW is in an ON state, the error flag issued from the compare circuit COM_50 for the lock step is collected by the error collection circuit ERR_50. When the error flag is issued, the error collection circuit ERR_50 makes an interrupt request for restarting the lock step to the system controller SYSC. The system controller SYSC performs the error processing of the power shut-off sequence in response to the interrupt request from the error collection circuit ERR_50, and restarts the master core 11 and the checker core 21.

Figure 16:
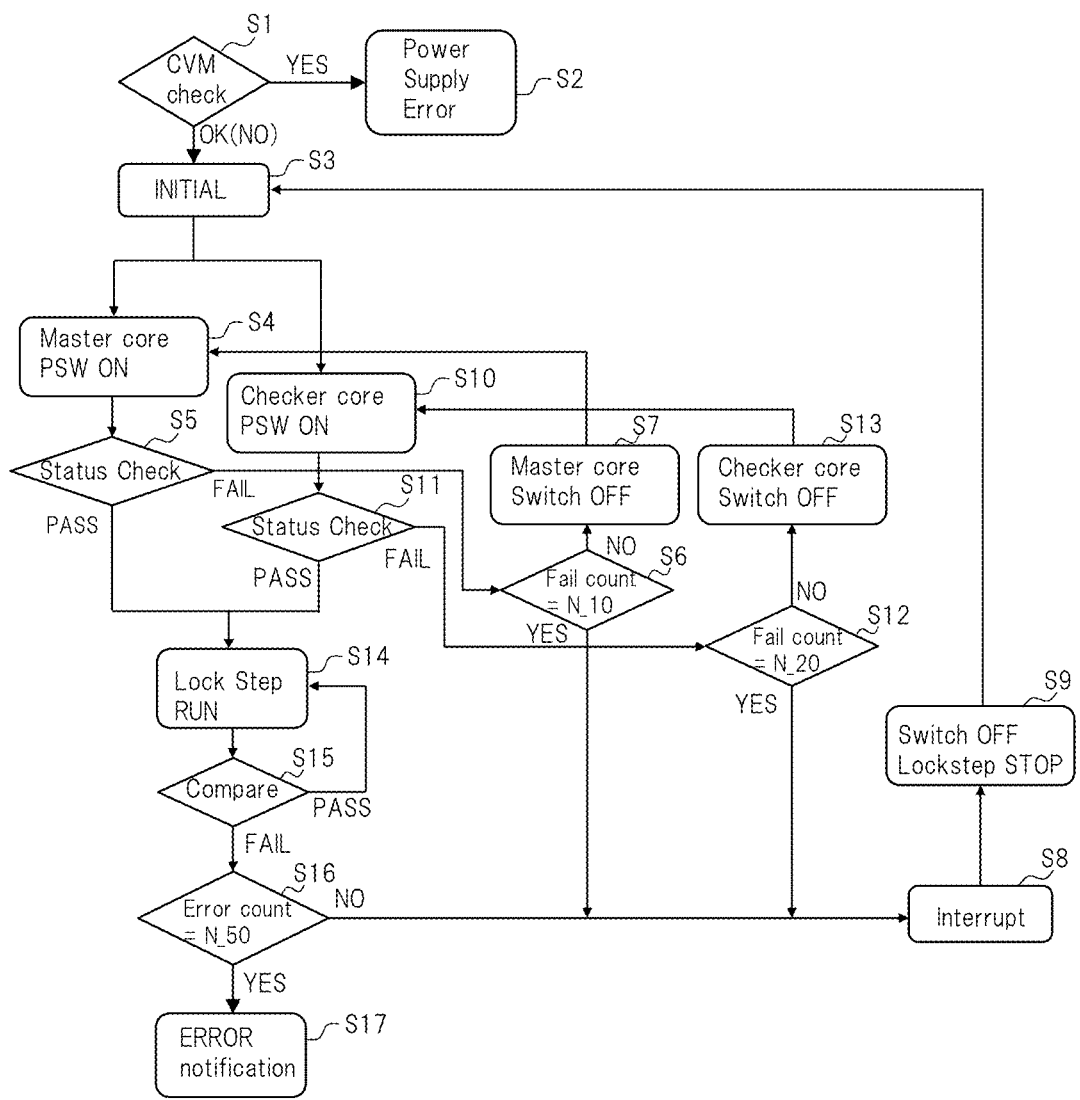
FIG. 16 is a flow chart of an error processing according to the first embodiment of the present invention.

FIG. 16 is a flow chart of the error processing according to the first embodiment of the present invention. After the power is turned on, the core voltage monitor circuit CVM monitors by voltage whether or not the power is correctly supplied to the power switch circuit SW (step S1). If there is an error in the power supply in step S1 (YES), the core voltage monitor circuit CVM issues a flag of power supply error (step S2). If there is no error in the power supply (OK), the flow proceeds to the initial setting for starting the CPU core (master core, checker core) (step S3), and further proceeds to the sequence of turning on the power switch circuit SW_10 of the master core 11 (step S4) and the sequence of turning on the power switch circuit SW_20 of the checker core 21 (step S10).

When the power switch circuit SW_10 of the master core 11 is turned on in step S4, the system controller SYSC monitors the response time of the power shut-off recovery signal ACK and/or the Schmidt circuit detection signal ASEB of the monitor circuit MON_10 and compares it with each requirement shown in FIG. 13 (step S5). In step S5, if the system controller SYSC does not detect an error when starting the master core 11 (power switch circuit SW_10) (PASS), the flow proceeds to step S14.

On the other hand, in step S5, if the system controller SYSC detects an error when starting the master core 11 (power switch circuit SW_10) (FAIL), it incrementally records the error count. Then, the system controller SYSC determines whether or not the error count is a predetermined error allowance count N_10 (step S6).

In step S6, if the error count is smaller than the error allowance count N_10 (NO), the system controller SYSC executes a sequence of turning off the power switch circuit SW_10 of the master core 11 (step S7). Then, returning to step S4, the system controller SYSC repeatedly executes the sequence of restarting the power switch circuit SW_10 of the master core 11.

In step S6, if the error count matches the error allowance count N_10 (YES), a core start error is issued (step S8), and a sequence of turning off the power switch circuit SW_10 of the master core 11 is executed (step S9). Then, the flow returns to step S3. At this time, the error count may be reset.

When the power switch circuit SW_20 of the checker core 21 is turned on in step S10, the system controller SYSC monitors the response time of the power shut-off recovery signal ACK and/or the Schmidt circuit detection signal ASEB of the monitor circuit MON_20 and compares it with each requirement shown in FIG. 13 (step S11). In step S11, if the system controller SYSC does not detect an error when starting the checker core 21 (power switch circuit SW_20) (PASS), the flow proceeds to step S14.

On the other hand, in step S11, if the system controller SYSC detects an error when starting the checker core 21 (power switch circuit SW_20) (FAIL), it incrementally records the error count. Then, the system controller SYSC determines whether or not the error count is a predetermined error allowance count N_20 (step S12).

In step S12, if the error count is smaller than the error allowance count N_20 (NO), the system controller SYSC executes a sequence of turning off the power switch circuit SW_20 of the checker core 21 (step S13). Then, returning to step S10, the system controller SYSC repeatedly executes the sequence of restarting the power switch circuit SW_20 of the checker core 21.

In step S12, if the error count matches the error allowance count N_20 (YES), a core start error is issued (step S8), and a sequence of turning off the power switch circuit SW_20 of the checker core 21 is executed (step S9). Then, the flow returns to step S3. At this time, the error count may be reset.

In step S14, the master core 11 and the checker core 21 are in the activated state, and the lock step is driven. Then, while the lock step is being driven, the compare circuit COM_50 compares the output data of the master core 11 and the output data of the checker core 21 (step S15).

In step S15, if the output data of the master core 11 and the output data of the checker core 21 match (PASS), the compare circuit COM_50 determines that no failure has occurred. Then, the flow returns to step S14, and the comparison of the output data is continued.

On the other hand, in step S15, if the output data of the master core 11 and the output data of the checker core 21 do not match (FAIL), the compare circuit COM_50 detects the failure occurrence and issues an error flag. The error collection circuit ERR_50 collects the error flag issued from the compare circuit COM_50, and incrementally counts up and records the error count. Then, the error collection circuit ERR_50 determines whether or not the error count is a predetermined error allowance count N_50 (step S16).

In step S16, if the error count is smaller than the error allowance count N_50 (NO), the error collection circuit ERR_50 makes an interrupt request for performing the error processing to the system controller SYSC (step S8).

The system controller SYSC executes the sequence of turning off the power switch circuit SW_10 of the master core 11 and the sequence of turning off the power switch circuit SW_20 of the checker core 21, and stops the lock step (step S9). Then, the flow returns to the initial sequence before turning on the power switch circuit (step S3).

At that time, the system controller SYSC checks the status of the power shut-off recovery signal ACK and/or the Schmidt circuit detection signal ASEB of each monitor circuit MON, and confirms whether or not it is a lock step error due to the failure of the power switch circuits SW_10 and SW_20. If it is not the error due to the failure of the power switch circuits SW_10 and SW_20, the arithmetic operation by lock step is retried.

Note that the status check of the power shut-off recovery signal ACK and/or the Schmidt circuit detection signal ASEB of each monitor circuit MON (MON_10, MON_20) may execute the verification at regular intervals by performing the polling while holding the status in the register, without being limited to the timing of the power shut-off and the power recovery. By performing the real-time error monitoring, it is possible to verify whether the state of the power recovery and the power shut-off can be surely maintained. 0106 On the other hand, in step S16, if the error count matches the error allowance count N_50 (YES), the error collection circuit ERR_50 detects the lock step error and notifies the system controller SYSC of the lock step error (step S17).

Main Effect by Present Embodiment

According to the present embodiment, the master core 11 and the checker core 21 are provided in different power shut-off domains 10 and 20, respectively, and the power supply to the power shut-off domains 10 and 20 is separated by the corresponding power switch circuits SW_10 and SW_20. This makes it possible to avoid the dependent failure due to common failure of the master core 11 and the checker core 21.

Further, the core voltage monitor circuit CVM that monitors the voltage of the power supply node of the compare circuit COM_50 configured to compare the output data of the master core 11 and the output data of the checker core 21 is provided.

According to this configuration, even if a failure occurs in each power supply path of the master core 11 and the checker core 21, the failure is detected by the compare circuit COM_50. Further, the failure of the power supply POW_1 itself is detected by the core voltage monitor circuit CVM. As described above, since it is not necessary to provide the core voltage monitor circuit CVM in each power supply path of the master core 11 and the checker core 21, it is possible to suppress the increase in chip area while ensuring safety.

Specifically, when the master core 11 and the checker core 21 belong to the power shut-off domain with the same power switch circuit, the common fail of the shut-off power supply cannot be detected by the compare circuit COM_50, and thus the shut-off power supply needs to be monitored by another core voltage monitor circuit. The core voltage monitor circuit requires a highly accurate failure detection voltage Vref_GEN, and has the large area cost in the chip. On the other hand, the power switch controller CNT and the monitor circuit MON shown in the present embodiment are composed of simple circuits, and have the small area cost. Therefore, the area cost can be significantly reduced by providing the configuration of the present embodiment.

Also, according to the present embodiment, the failure detection method of a shut-off power supply by monitoring the gate voltage of the switching element SWa of the power switch circuit is shown as a failure detection method of the power switch circuit. This method is realized by the cooperation of the system controller SYSC and the power switch controller CNT.

In addition, since the power switch controller CNT is configured to have a small driver function, it is possible to improve the failure detection sensitivity.

In addition, by monitoring the gate voltage of the switching element SWa based on two types of systems such as the Schmidt circuit SCH and the comparator COM_MON, the safety can be further improved.

Furthermore, by multiplexing the monitor circuit MON with a plurality of comparators (COM_MON1, COM_MON2), it is possible to further improve the safety.

Second Embodiment

Next, the second embodiment will be described. In the following, the description overlapped with the embodiment above will be omitted in principle.

Figure 17:
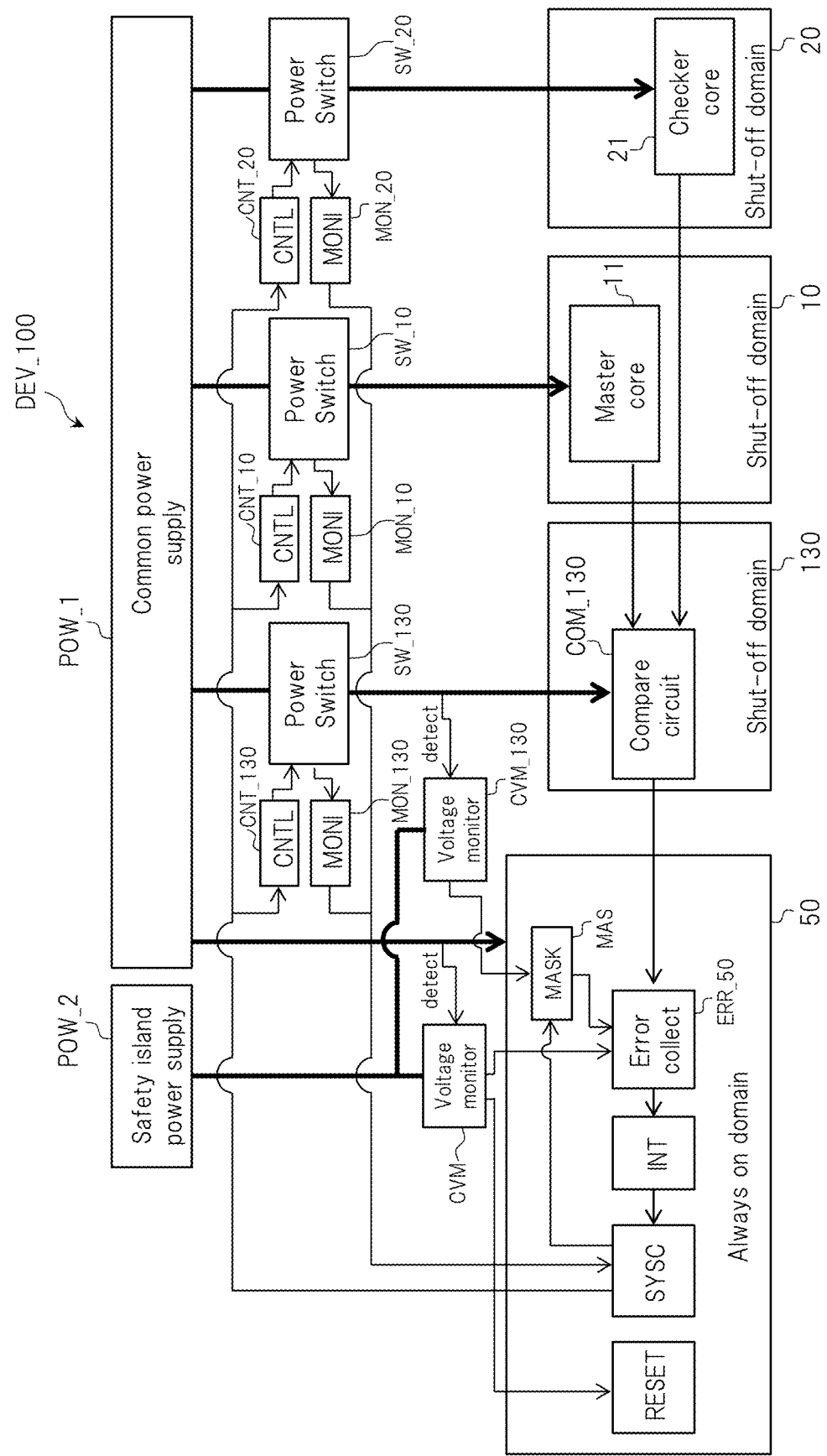
FIG. 17 is a configuration diagram showing an example of an in-vehicle semiconductor device according to the second embodiment of the present invention.

FIG. 17 is a configuration diagram showing an example of a semiconductor device according to the second embodiment of the present invention. As shown in FIG. 17, in a semiconductor device DEV_100 of the present embodiment, a compare circuit COM_130 constituting the lock step is arranged in a power shut-off domain 130. Also, a power switch circuit (power switch circuit for comparator) SW_130, a power switch controller CNT_130, and a monitor circuit MON_130 corresponding to the power shut-off domain 130 are provided. Since the configurations of the power switch circuit SW_130, the power switch controller CNT_130, and the monitor circuit MON_130 corresponding to the power shut-off domain 130 are the same as those of the monitor circuits MON_10 and MON_20 corresponding to the power shut-off domains 10 and 20, detailed descriptions thereof will be omitted.

In the present embodiment, the failure of the power supply path of the compare circuit COM_130 needs to be detected. Therefore, a core voltage monitor circuit CVM_130 is provided. Since the configuration of the core voltage monitor circuit CVM_130 is the same as that of the core voltage monitor circuit CVM, detailed descriptions thereof will be omitted.

Incidentally, when the power shut-off of the compare circuit COM_130 is performed, the voltage of the power supply node of the compare circuit COM_130 is reduced by turning off the power switch circuit. Consequently, the monitor circuit MON_130 erroneously detects the power supply failure of the compare circuit COM_130. Therefore, as shown in FIG. 17, a mask circuit MAS that masks the output data of the monitor circuit MON_130 is provided in the always-on domain 50.

Figure 18:
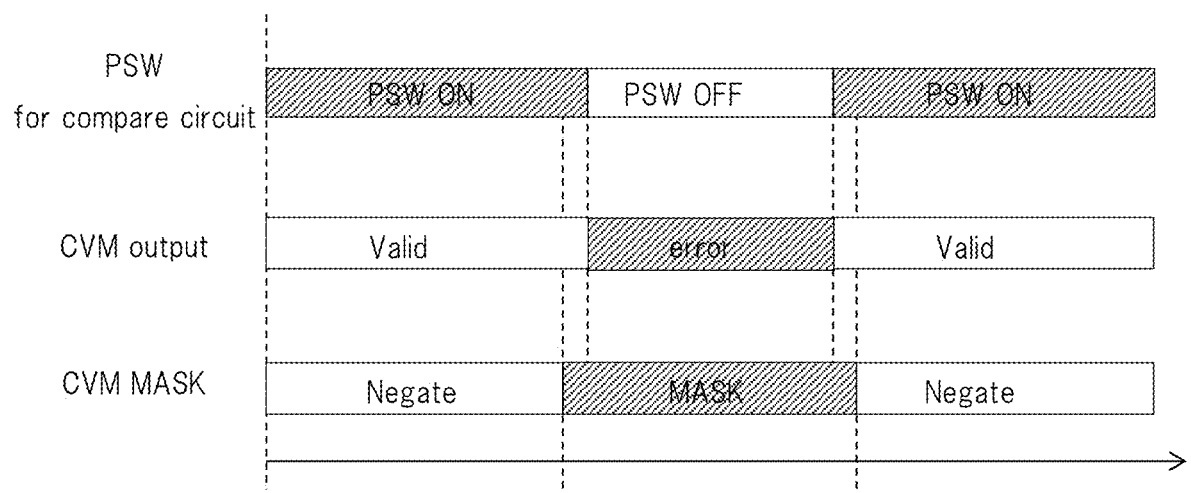
FIG. 18 is a timing chart diagram showing an example of a mask processing.

FIG. 18 is a timing chart diagram showing an example of a mask processing. FIG. 18 shows an ON/OFF state of the power switch circuit SW_130 corresponding to a comparator COMP_130, output data of the core voltage monitor circuit CVM_130, and the presence/absence of a mask.

As shown in FIG. 18, since the core voltage monitor circuit CVM_130 detects an error when the power switch circuit SW_130 is turned off, the mask processing on the core voltage monitor circuit CVM_130 is performed the power switch circuit SW_130 is turned off (MASK). Specifically, the system controller SYSC asserts the mask signal, whereby the core voltage monitor circuit CVM_130 is brought into the masked state. Namely, when the power switch circuit SW_130 is in an OFF state, the core voltage monitor circuit CVM_130 is masked.

Also, when the power switch circuit SW_130 is turned on and the power recovery is completed, the system controller SYSC negates the mask signal to release the mask of the core voltage monitor circuit CVM_130.

According to the present embodiment, when the core is in an OFF state, the standby power of the compare circuit COM_130 can be reduced, and it is thus possible to further reduce the power consumption.

Third Embodiment

Next, the third embodiment will be described. In the present embodiment, the majority logic is adopted, and failure detection is performed on the assumption that the output data on the majority side of the plurality of cores is correct data.

Figure 19:
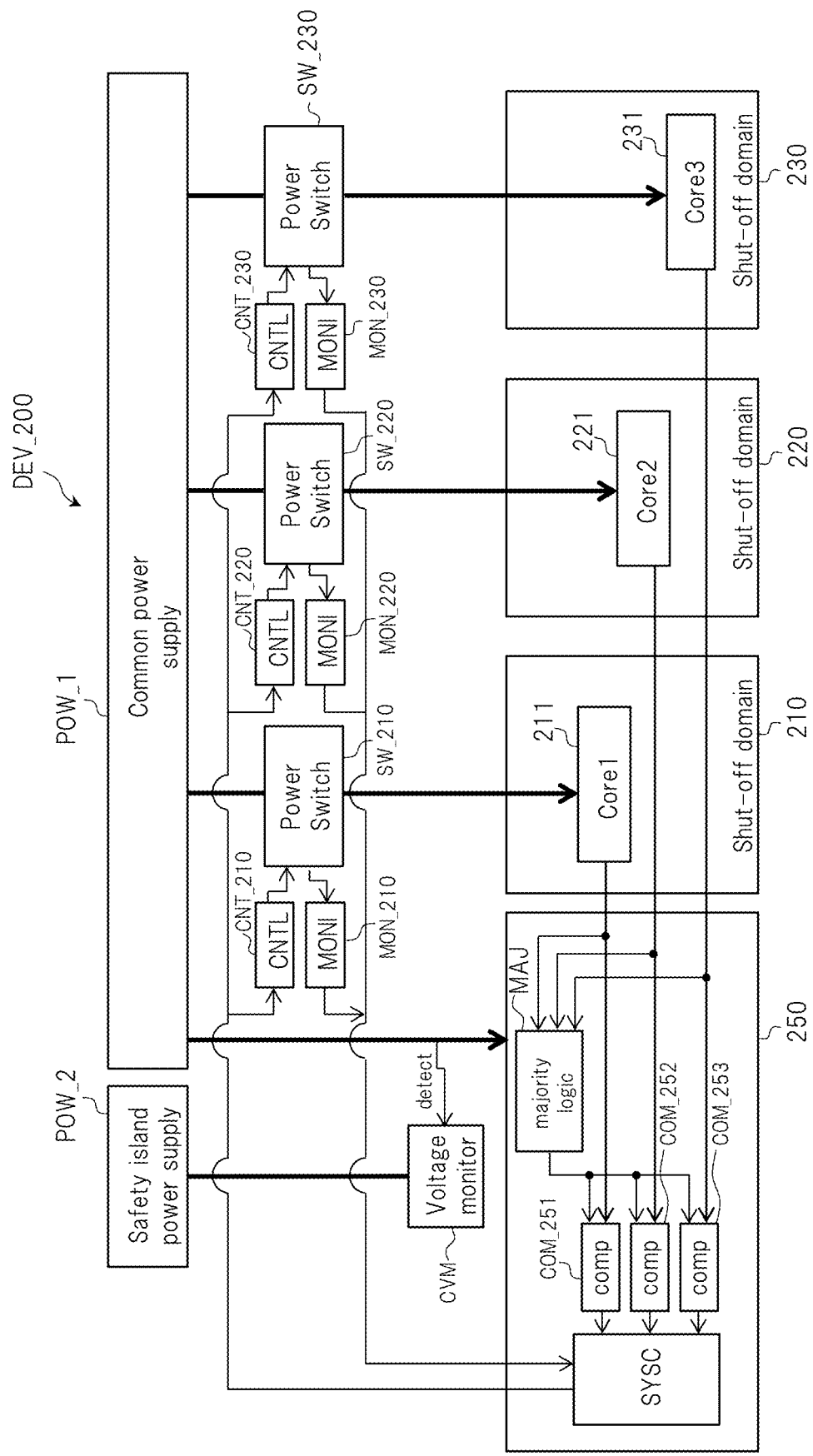
FIG. 19 is a configuration diagram showing an example of a semiconductor device according to the third embodiment of the present invention.

FIG. 19 is a configuration diagram showing an example of a semiconductor device according to the third embodiment of the present invention. As shown in FIG. 19, a semiconductor device DEV_200 of the present embodiment includes power shut-off domains 210, 220, and 230 of which the power from the power supply POW_1 is controlled to be turned on and off and an always-on domain 250 to which power is constantly supplied from the power supply POW_1. Cores 211, 221, and 231 having the same configuration are provided in the power shut-off domains 210, 220, and 230, respectively. The number of cores may be 4 or more.

A power switch circuit SW_210, a power switch controller CNT_210, and a monitor circuit MON_210 corresponding to the power shut-off domain 210 are provided. A power switch circuit SW_220, a power switch controller CNT_220, and a monitor circuit MON_220 corresponding to the power shut-off domain 220 are provided. A power switch circuit SW_230, a power switch controller CNT_230, and a monitor circuit MON_230 corresponding to the power shut-off domain 230 are provided. Since the configurations of these are the same as those of the circuits corresponding to the power shut-off domains 10, 20, and the like, detailed descriptions thereof will be omitted.

In the always-on domain 250, the system controller SYSC, a majority logic circuit MAJ, compare circuits COM_251, COM_252, and COM_253 corresponding to the cores 211, 221, and 231, respectively, are provided. In the present embodiment, the core voltage monitor circuit CVM monitors the voltage of the node that connects the power supply POW_1 and the majority logic circuit MAJ, the compare circuit COM_251, the compare circuit COM_252, or the compare circuit COM_253.

The majority logic circuit MAJ receives the output data of the cores 211, 221, and 231 as input, selects, as correct data, the data of which the number of cores that output the same data is the largest, and outputs the selected data determined as the majority data to the compare circuits COM_251, COM_253, and COM_253.

The compare circuits COM_251, COM_252, and COM_253 compare the output data of the corresponding cores 211, 221, and 231 with the majority data. The compare circuits COM_251, COM_252, and COM_253 issue an error flag when the output data of the corresponding cores 211, 221, and 231 are different from the majority data.

<Error Processing>

Figure 20:
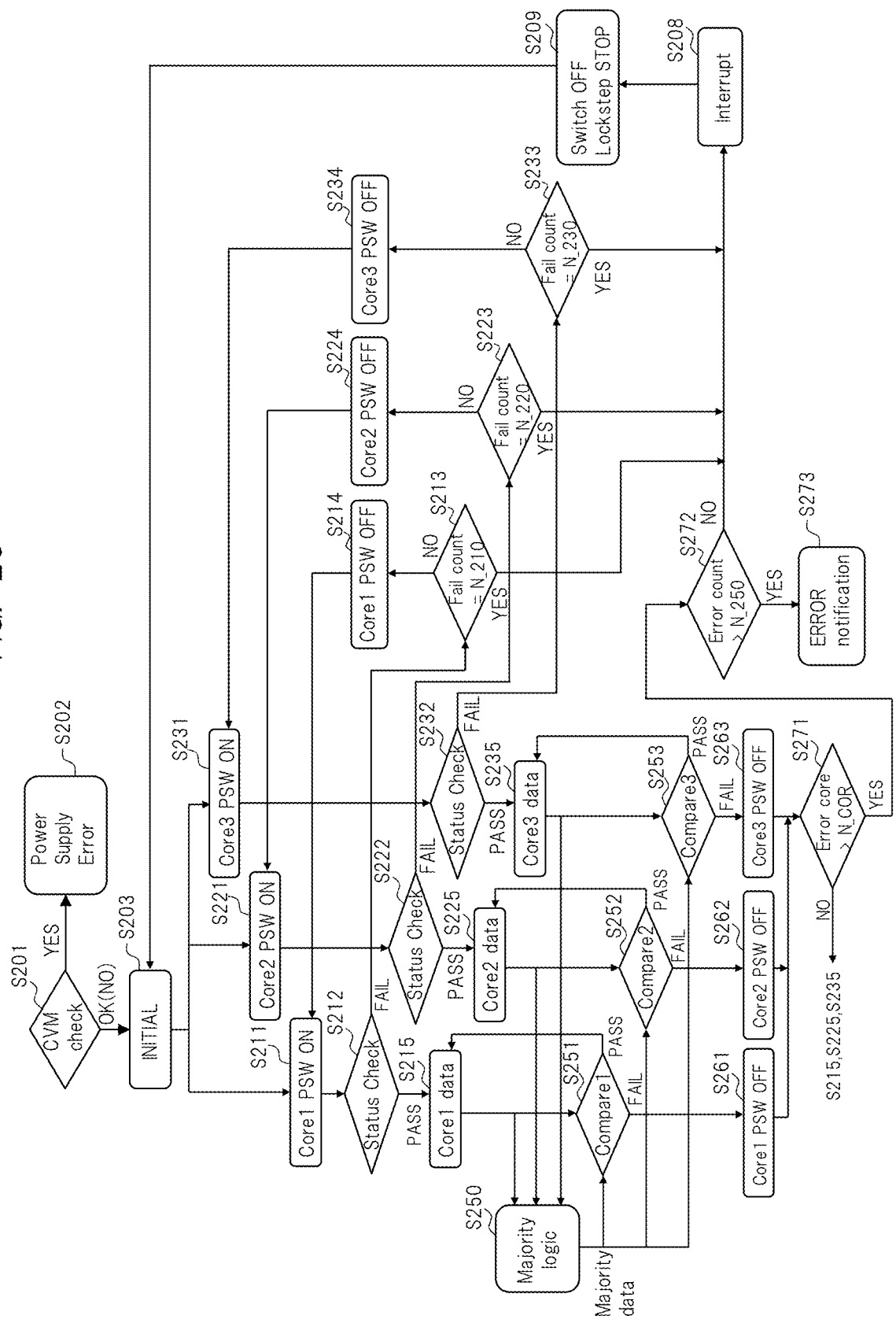
FIG. 20 is a flow chart of an error processing according to the third embodiment of the present invention.

Next, an error processing according to the present embodiment will be described. FIG. 20 is a flow chart of the error processing according to the third embodiment of the present invention.

Steps S201 to S203 and steps S208 and S209 of FIG. 20 are the same as the steps S1 to S3 and the steps S8 and S9 of FIG. 16, respectively. Steps S211 to S214 corresponding to the core 211, steps S221 to S224 corresponding to the core 221, and steps S231 to S234 corresponding to the core 231 are the same as the steps S4 to S7 or the steps S10 to S13 of FIG. 16, respectively.

If no error is detected when the core 211 (power switch circuit SW_210) is started in step S212 (PASS), the core 211 outputs the data in accordance with the input data to the majority logic circuit MAJ and the compare circuit COM_251 (step S215).

Similarly, if no error is detected when the core 221 (power switch circuit SW_220) is started in step S222 (PASS), the core 221 outputs the data in accordance with the input data to the majority logic circuit MAJ and the compare circuit COM_252 (Step S225).

Similarly, if no error is detected when the core 231 (power switch circuit SW_230) is started in step S232 (PASS), the core 231 outputs the data in accordance with the input data to the majority logic circuit MAJ and the compare circuit COM_253. (Step S235).

In step S250, the majority logic circuit MAJ receives the output data of the cores 211, 221, and 231 as input, selects, as majority data, the data of which the number of cores that output the same data (the number of the same data) is the largest, and outputs the majority data to the compare circuits COM_251, COM_252, and COM_253.

In step S251, the compare circuit COM_251 compares the output data of the core 211 with the majority data. When these data are the same (PASS), the flow returns to step S215, and the process of step S215 and steps S250 and S251 is repeatedly executed.

On the other hand, when these data are different (FAIL), the compare circuit COM_251 issues an error flag of the core 211. The system controller SYSC stops the core 211 by turning off the power switch circuit SW_210 based on the error flag issued from the compare circuit COM_251 (step S261). Also, the system controller SYSC increments the error count. Further, the system controller SYSC increments the count of the failed core when the error of the core 211 is detected for the first time.

In step S252, the compare circuit COM_252 compares the output data of the core 221 with the majority data. When these data are the same (PASS), the flow returns to step S225, and the process of steps S225, S250, and S252 is repeatedly executed.

On the other hand, when these data are different (FAIL), the compare circuit COM_252 issues an error flag of the core 221. The system controller SYSC stops the core 221 by turning off the power switch circuit SW_220 based on the error flag issued from the compare circuit COM_252 (step S262). Also, the system controller SYSC increments the error count. Further, the system controller SYSC increments the count of the failed core when the error of the core 221 is detected for the first time.

In step S253, the compare circuit COM_253 compares the output data of the core 231 with the majority data. When these data are the same (PASS), the flow returns to step S235, and the process of steps S235, S250, and S253 is repeatedly executed.

On the other hand, when these data are different (FAIL), the compare circuit COM_253 issues an error flag of the core 231. The system controller SYSC stops the core 231 by turning off the power switch circuit SW_230 based on the error flag issued from the compare circuit COM_253 (step S263). Also, the system controller SYSC increments the error count. Further, the system controller SYSC increments the count of the failed core when the error of the core 231 is detected for the first time.

In step S271, it is determined whether the number of cores in which an error has occurred is larger than the predetermined number N_COR. When the number of cores in which an error has occurred is equal to or less than the predetermined number N_COR (NO), the flow returns to steps S215, S225, and S235, and error detection for each core is continued. Note that the core in which a failure has already been detected has been stopped, and thus it cannot output correct data, but since this data is excluded by the majority logic, it does not affect the selection of the majority data.

Note that the predetermined number N_COR relating to the core in which the error has occurred is set by a user to an arbitrary value that can select the majority data by the majority logic circuit MAJ. For example, in the case of FIG. 20, N_COR is set to 1 (N_COR=1), but if the number of cores is large, the number N_COR can be set to a larger value.

On the other hand, in step S271, when the number of cores in which an error has occurred is larger than the predetermined number N_COR (YES), it is determined whether the total of the error counts of all the cores 211, 221, and 231 is larger than a predetermined error allowance count N_250 (step S272).

When the total of error counts is equal to or less than the predetermined error allowance count N_250 in step S272 (NO), the system controller SYSC makes an interrupt request for performing the error processing (step S208).

The system controller SYSC stops the cores 211, 221, and 231 by executing a sequence of turning off the power switch circuits SW_210, SW_220, and SW_230 of the cores 211, 221, and 231 (step S209). Then, the flow returns to the initial sequence before the power switch circuit is turned on (step S203).

At that time, the system controller SYSC checks the status of the power shut-off recovery signal ACK and/or the Schmidt circuit detection signal ASEB of each monitor circuit MON, and confirms whether the error is due to the failure of the power switch circuits SW_210, SW_220, and SW_230. If the error is not due to the failure of the power switch circuits SW_210, SW_220, and SW230, the retry is performed. As described above, when the number of cores in which an error has occurred is larger than the predetermined number N_COR and the error count is equal to or less than the predetermined error allowance count N_250, the power supply for all the cores is turned off and then restarted.

On the other hand, when the total of error counts matches the error allowance count N_250 in step S272 (YES), the system controller SYSC detects an error in the cores 211, 221 and 231 (power switch circuits SW_210, SW_220, SW230), and notifies the error by issuing an error flag (step S273).

As described above, when the number of cores in which an error has occurred is larger than the predetermined number N_COR and the total of error counts is larger than the predetermined error allowance count N_250, the system controller SYSC determines that the error cannot be initialized and issues an error flag.

Main Effect by Present Embodiment

According to the present embodiment, it is possible to perform the failure detection in the power shut-off domains using the majority logic circuit MAJ. As a result, even if a failure occurs in any of the cores or the power supply path of the cores, the normal operation and the error detection processing can be continued using the majority data obtained by the majority logic.

Also, according to the present embodiment, it is possible to specify the core whose output data is different from the majority data obtained by the majority logic, and to stop the power supply to the core in which the failure has occurred, so that the increase in power consumption can be suppressed.

Further, according to the present embodiment, the output data of the core whose power supply is stopped is different from the output data of the other cores, but this output data is excluded by the majority logic. Therefore, it is possible to output correct data while suppressing the increase in power consumption.

Although the invention made by the inventors has been specifically described above based on embodiments, it goes without saying that the present invention is not limited to the above-described embodiments and can be variously modified without departing from the gist thereof.

What is claimed is:

1. A semiconductor device comprising:
   master and checker cores configured to receive power from a common power supply to perform a lock step;
   first and second power switch circuits provided so as to respectively correspond to the master and checker cores and configured to control ON and OFF of the power supplied to the corresponding cores;
   a compare circuit configured to compare output data of the master and checker cores to detect a lock step error;
   a core voltage monitor circuit configured to monitor a voltage of a node that connects the power supply and an always-on domain to which the power from the power supply is constantly supplied to detect a failure of the power supply;
   first and second power switch controllers provided so as to respectively correspond to the first and second power switch circuits and configured to control the corresponding power switch circuits;
   first and second monitor circuits provided so as to respectively correspond to the first and second power switch circuits and configured to detect a failure of the corresponding power switch circuits; and
   a system controller configured to control the first and second power switch controllers and receive a monitoring result of the corresponding power switch circuits by the first and second monitor circuits,
   wherein the compare circuit and the system controller are disposed in the always-on domain.

2. The semiconductor device according to claim 1,
   wherein each of the first and second power switch circuits has a plurality of switching elements arranged in parallel between the power supply and the corresponding core,
   wherein a buffer is arranged between gates of the adjacent switching elements, and
   wherein a gate of the switching element at a first stage is connected to the power switch controller.

3. The semiconductor device according to claim 1,
   wherein each of the first and second power switch circuits has a plurality of switching elements arranged in parallel between the power supply and the corresponding core,
   wherein gates of the switching elements are connected to the power switch controller, and
   wherein each of the first and second power switch controllers includes a small driver having a low capability and a large driver having a capability higher than that of the small driver, and the power switch circuit is turned on by turning on the small driver and turning off the large driver, and then turning on the large driver.

4. The semiconductor device according to claim 3,
   wherein each of the first and second monitor circuits includes a Schmidt circuit, and
   wherein the Schmidt circuit is configured to monitor a gate voltage of the switching element when the small driver is turned on and the large driver is turned off.

5. The semiconductor device according to claim 3,
   wherein each of the first and second monitor circuits includes a monitor comparator, and
   wherein the monitor comparator is configured to monitor a gate voltage of the switching element when the small driver is turned on and the large driver is turned on.

6. The semiconductor device according to claim 5, wherein each of the first and second monitor circuits includes a plurality of the monitor comparators and a circuit configured to aggregate output results of the plurality of monitor comparators.

7. A semiconductor device comprising:
   a plurality of cores configured to receive power from a power supply;
   a plurality of power switch circuits provided so as to correspond to each of the cores and configured to control the power supplied to the corresponding cores;
   a compare circuit configured to receive power from the power supply and compare output data of the plurality of cores;
   a compare-circuit-power-switch circuit provided so as to correspond to the compare circuit and configured to control power supplied to the compare circuit;
   a core voltage monitor circuit configured to monitor a voltage of a node that connects the power supply and the compare circuit; and
   a mask circuit to which power is constantly supplied from the power supply and which is configured to mask the core voltage monitor circuit when the compare-circuit-power-switch circuit is turned off.

8. A semiconductor device comprising:
a plurality of cores configured to receive power from a power supply;
a plurality of power switch circuits provided so as to correspond to each of the cores and configured to control the power supplied to the corresponding cores;
a majority logic circuit to which power is constantly supplied from the power supply and which is configured to select, as majority data, data of which the number of cores that output the same data is the largest and output the majority data;
a plurality of compare circuits to which power is constantly supplied from the power supply and which is provided so as to correspond to each of the cores and configured to compare the output data of the corresponding core and the majority data; and
a core voltage monitor circuit configured to monitor a voltage of a node that connects the power supply and the majority logic circuit or the compare circuit.

* * * * *